United States Patent
Pant

(10) Patent No.: US 8,829,901 B2
(45) Date of Patent: Sep. 9, 2014

(54) METHOD OF USING A MAGNETORESISTIVE SENSOR IN SECOND HARMONIC DETECTION MODE FOR SENSING WEAK MAGNETIC FIELDS

(75) Inventor: Bharat B. Pant, Minneapolis, MN (US)

(73) Assignee: Honeywell International Inc., Morristown, NJ (US)

( * ) Notice: Subject to any disclaimer, the term of this patent is extended or adjusted under 35 U.S.C. 154(b) by 536 days.

(21) Appl. No.: 13/289,800

(22) Filed: Nov. 4, 2011

(65) Prior Publication Data

US 2013/0113478 A1     May 9, 2013

(51) Int. Cl.
*G01R 33/02*     (2006.01)
*G01R 33/09*     (2006.01)

(52) U.S. Cl.
CPC .............. G01R 33/093 (2013.01); G01R 33/02 (2013.01)
USPC ....... 324/252; 324/207.21; 324/225; 324/249; 324/244; 324/247; 324/260; 324/262; 324/245; 365/7; 365/8; 365/158; 360/313; 360/315; 360/320; 360/325; 360/326; 360/327; 360/324; 360/323; 360/322; 428/811

(58) Field of Classification Search
CPC ............................. G01R 33/093; G01R 33/02
USPC ............... 324/207.21, 252, 225, 249, 297.21, 324/247, 244, 260, 262, 245, 117 R, 117 H, 324/126, 207.2, 207.11–207.14, 324/207.22–207.26, 251, 210–212; 338/32 R; 428/811; 360/313–327, 31; 365/7–8, 158; 257/E43.001–E43.007; 327/511
See application file for complete search history.

(56) References Cited

U.S. PATENT DOCUMENTS

| | | | | | |
|---|---|---|---|---|---|
| 2,571,915 | A | * | 10/1951 | McCoubrey | 324/118 |
| 2,649,568 | A | * | 8/1953 | Felch, Jr. et al. | 324/254 |
| 2,958,036 | A | * | 10/1960 | Gilbert | 323/362 |
| 3,007,106 | A | * | 10/1961 | Bergh et al. | 324/127 |
| 3,254,298 | A | * | 5/1966 | Ellis et al. | 324/210 |
| 3,255,316 | A | * | 6/1966 | Krones | 360/134 |
| 3,333,192 | A | * | 7/1967 | Geyger | 324/117 R |
| 3,492,662 | A | * | 1/1970 | Tanguy, Jr. et al. | 365/201 |
| 4,464,625 | A | * | 8/1984 | Lienhard et al. | 324/117 R |
| 4,757,410 | A | * | 7/1988 | Seko et al. | 360/316 |
| 4,914,381 | A | * | 4/1990 | Narod | 324/117 R |
| 4,987,509 | A | * | 1/1991 | Gill et al. | 360/315 |

(Continued)

OTHER PUBLICATIONS

Suzuki et al., "A Self-Biased Spin Valve Sensor with a Longitudinally Pinned Layer", IEEE Transactions on Magnetics, vol. 34, No. 4, Jul. 1998, p. 1501-1503.*

(Continued)

*Primary Examiner* — Patrick Assouad
*Assistant Examiner* — Lamarr Brown
(74) *Attorney, Agent, or Firm* — Fogg & Powers LLC

(57) ABSTRACT

A method to measure a magnetic field is provided. The method includes applying an alternating drive current to a drive strap overlaying a magnetoresistive sensor to shift an operating point of the magnetoresistive sensor to a low noise region. An alternating magnetic drive field is generated in the magnetoresistive sensor by the alternating drive current. When the magnetic field to be measured is superimposed on the alternating magnetic drive field in the magnetoresistive sensor, the method further comprises extracting a second harmonic component of an output of the magnetoresistive sensor. The magnetic field to be measured is proportional to a signed amplitude of the extracted second harmonic component.

20 Claims, 13 Drawing Sheets

(56) References Cited

U.S. PATENT DOCUMENTS

| | | | | |
|---|---|---|---|---|
| 5,155,643 | A * | 10/1992 | Jones et al. | 360/315 |
| 5,465,185 | A * | 11/1995 | Heim et al. | 360/324.11 |
| 5,517,104 | A * | 5/1996 | Kawakami | 324/117 R |
| 5,721,488 | A * | 2/1998 | Sakai et al. | 324/210 |
| 5,747,997 | A | 5/1998 | Dahlberg | |
| 5,764,567 | A * | 6/1998 | Parkin | 365/173 |
| 5,767,667 | A * | 6/1998 | Shafie | 324/117 R |
| 5,801,984 | A * | 9/1998 | Parkin | 365/158 |
| 5,825,179 | A * | 10/1998 | Sherman et al. | 324/210 |
| 5,998,993 | A * | 12/1999 | Inage et al. | 324/210 |
| 6,052,263 | A * | 4/2000 | Gill | 360/324.11 |
| 6,233,172 | B1 | 5/2001 | Chen et al. | 365/173 |
| 6,304,397 | B1 * | 10/2001 | Ozue et al. | 360/29 |
| 6,323,634 | B1 * | 11/2001 | Nakagawa et al. | 324/117 R |
| 6,331,773 | B1 * | 12/2001 | Engel | 324/252 |
| 6,340,885 | B1 * | 1/2002 | Hachisuka et al. | 324/210 |
| 6,387,550 | B1 * | 5/2002 | Koike et al. | 428/811.3 |
| 6,411,078 | B1 * | 6/2002 | Nakagawa et al. | 324/117 H |
| 6,418,048 | B1 * | 7/2002 | Sin et al. | 365/173 |
| 6,452,204 | B1 * | 9/2002 | Ishiwata et al. | 257/9 |
| 6,509,621 | B2 * | 1/2003 | Nakao | 257/421 |
| 6,562,486 | B2 * | 5/2003 | Sakakima et al. | 428/811 |
| 6,611,405 | B1 * | 8/2003 | Inomata et al. | 360/324.2 |
| 6,700,371 | B2 * | 3/2004 | Witcraft et al. | 324/252 |
| 6,714,444 | B2 * | 3/2004 | Huai et al. | 365/171 |
| 6,847,510 | B2 * | 1/2005 | Childress et al. | 360/324.2 |
| 6,934,100 | B2 * | 8/2005 | Ueno | 360/31 |
| 6,989,949 | B2 * | 1/2006 | Cheng et al. | 360/31 |
| 7,195,945 | B1 * | 3/2007 | Edelstein et al. | 438/48 |
| 7,220,498 | B2 * | 5/2007 | Nagahama et al. | 428/811.1 |
| 7,224,601 | B2 | 5/2007 | Panchula | |
| 7,906,231 | B2 * | 3/2011 | Parkin | 428/811 |
| 8,242,776 | B2 * | 8/2012 | Mather et al. | 324/249 |
| 8,441,252 | B2 * | 5/2013 | Suzuki | 324/207.21 |
| 2001/0026470 | A1 * | 10/2001 | Gillies et al. | 365/158 |
| 2003/0072109 | A1 * | 4/2003 | Sharma et al. | 360/324.2 |
| 2003/0087130 | A1 * | 5/2003 | Sugawara | 428/692 |
| 2003/0206381 | A1 * | 11/2003 | Hou et al. | 360/324.11 |
| 2003/0214762 | A1 * | 11/2003 | Sharma et al. | 360/324.2 |
| 2004/0130431 | A1 * | 7/2004 | Matsukawa et al. | 338/32 R |
| 2004/0144995 | A1 * | 7/2004 | Nagahama et al. | 257/200 |
| 2004/0164840 | A1 | 8/2004 | Xiao | |
| 2005/0098807 | A1 * | 5/2005 | Katti | 257/295 |
| 2005/0122635 | A1 * | 6/2005 | Freitag et al. | 360/324.11 |
| 2005/0122636 | A1 * | 6/2005 | Carey et al. | 360/324.11 |
| 2005/0128652 | A1 * | 6/2005 | Freitag et al. | 360/324.11 |
| 2005/0189574 | A1 * | 9/2005 | Nguyen et al. | 257/295 |
| 2005/0237787 | A1 * | 10/2005 | Huai et al. | 365/158 |
| 2006/0002031 | A1 * | 1/2006 | Shoji | 360/313 |
| 2006/0102969 | A1 * | 5/2006 | Huai et al. | 257/295 |
| 2006/0186445 | A1 * | 8/2006 | Katti | 257/295 |
| 2006/0187592 | A1 * | 8/2006 | Noma | 360/324.12 |
| 2006/0192237 | A1 * | 8/2006 | Huai | 257/296 |
| 2006/0221512 | A1 * | 10/2006 | Gill et al. | 360/324.12 |
| 2006/0227465 | A1 * | 10/2006 | Inokuchi et al. | 360/324.1 |
| 2006/0227466 | A1 * | 10/2006 | Yagami | 360/324.2 |
| 2006/0244021 | A1 * | 11/2006 | Klostermann et al. | 257/295 |
| 2006/0262594 | A1 * | 11/2006 | Fukumoto | 365/158 |
| 2007/0014143 | A1 * | 1/2007 | Doudin | 365/145 |
| 2007/0019338 | A1 * | 1/2007 | Childress et al. | 360/324.1 |
| 2007/0030728 | A1 * | 2/2007 | Kent et al. | 365/171 |
| 2007/0058302 | A1 * | 3/2007 | Tokura et al. | 360/324.2 |
| 2007/0063690 | A1 * | 3/2007 | De Wilde et al. | 324/117 R |
| 2007/0070556 | A1 * | 3/2007 | Zhang et al. | 360/324.11 |
| 2007/0085068 | A1 * | 4/2007 | Apalkov et al. | 257/1 |
| 2007/0128470 | A1 * | 6/2007 | Nagahama et al. | 428/811.1 |
| 2007/0145968 | A1 * | 6/2007 | Jorgensen | 324/127 |
| 2007/0165339 | A1 * | 7/2007 | Welipitiya | 360/324.11 |
| 2007/0187785 | A1 * | 8/2007 | Hung et al. | 257/421 |
| 2007/0196933 | A1 * | 8/2007 | Drewes | 438/3 |
| 2007/0215955 | A1 * | 9/2007 | Wu et al. | 257/401 |
| 2007/0297103 | A1 * | 12/2007 | Zhang et al. | 360/324.12 |
| 2007/0297222 | A1 * | 12/2007 | Leuschner | 365/171 |
| 2008/0007994 | A1 * | 1/2008 | Guo | 365/158 |
| 2008/0008908 | A1 * | 1/2008 | Ishiwata et al. | 428/811 |
| 2008/0074799 | A1 * | 3/2008 | Ishiwata | 360/314 |
| 2008/0182015 | A1 * | 7/2008 | Parkin | 427/131 |
| 2008/0224695 | A1 | 9/2008 | Leroy | |
| 2008/0230819 | A1 * | 9/2008 | Nguyen et al. | 257/295 |
| 2008/0278867 | A1 * | 11/2008 | Fukumoto et al. | 360/324.12 |
| 2008/0291584 | A1 * | 11/2008 | Parkin | 360/324.2 |
| 2009/0073748 | A1 * | 3/2009 | Klostermann | 365/158 |
| 2009/0140358 | A1 * | 6/2009 | Nakayama et al. | 257/421 |
| 2009/0140732 | A1 * | 6/2009 | Shrinkle et al. | 324/210 |
| 2009/0219754 | A1 * | 9/2009 | Fukumoto | 365/158 |
| 2009/0224755 | A1 * | 9/2009 | Kahlman et al. | 324/252 |
| 2009/0243698 | A1 | 10/2009 | Kakinuma | |
| 2009/0278533 | A1 * | 11/2009 | Chang | 324/247 |
| 2009/0290410 | A1 * | 11/2009 | Wang et al. | 365/158 |
| 2010/0046288 | A1 * | 2/2010 | Honjou et al. | 365/171 |
| 2010/0148167 | A1 * | 6/2010 | Whig et al. | 257/43 |
| 2010/0177448 | A1 | 7/2010 | Kaka | |
| 2011/0025320 | A1 * | 2/2011 | Ohta et al. | 324/252 |
| 2011/0037459 | A1 * | 2/2011 | Okada et al. | 324/207.25 |
| 2011/0086439 | A1 * | 4/2011 | Choi | 438/3 |
| 2011/0096443 | A1 * | 4/2011 | Zhang et al. | 360/324.2 |
| 2012/0064640 | A1 * | 3/2012 | Guo et al. | 438/3 |
| 2012/0154955 | A1 * | 6/2012 | Tsoukatos et al. | 360/319 |
| 2012/0161263 | A1 * | 6/2012 | Maat et al. | 257/422 |
| 2012/0181644 | A1 * | 7/2012 | Ducruet et al. | 257/421 |
| 2012/0212217 | A1 * | 8/2012 | Engel et al. | 324/252 |
| 2012/0241827 | A1 * | 9/2012 | Daibou et al. | 257/295 |
| 2012/0241881 | A1 * | 9/2012 | Daibou et al. | 257/421 |
| 2012/0257447 | A1 * | 10/2012 | Zheng et al. | 365/158 |
| 2012/0262152 | A1 * | 10/2012 | Ausserlechner | 324/117 R |
| 2012/0268846 | A1 * | 10/2012 | Gadbois et al. | 360/319 |
| 2012/0281319 | A1 * | 11/2012 | Singleton et al. | 360/319 |
| 2012/0314332 | A1 * | 12/2012 | Fries et al. | 361/152 |
| 2012/0329177 | A1 * | 12/2012 | Abraham et al. | 438/3 |
| 2013/0049749 | A1 * | 2/2013 | Mohan et al. | 324/252 |
| 2014/0003138 | A1 * | 1/2014 | Lou et al. | 365/158 |

OTHER PUBLICATIONS

Edelstein, "Progress Toward a Thousandfold Reduction in 1/F Noise in Magnetic Sensors Using an AC Microelectromechanical System Flux", "Journal of Applied Physics", Apr. 27, 2006, pp. 1-6, vol. 99, No. 08B317, Publisher: American Institute of Physics.

Egelhoff, "Critical Challenges for Picotesla Magnetic-Tunnel-Junction Sensors", "Sensors and Acuators A: Physical", Aug. 26, 2009, pp. 217-225, vol. A, No. 155, Publisher: Elsevier B.V.

Liu, "Magnetic Tunnel Junction Field Sensors With Hard-Axis Bias Field", "Journal Applied Physics", Oct. 15, 2002, pp. 4722-4725, vol. 92, No. 8, Publisher: American Institue of Physics.

Primdahl, "The Fluxgate Magnetometer", "Journal of Physics E: Scientific Instruments", 1979, pp. 241-253, vol. 12.

Zhu, "Magnetic Tunnel Junctions", "Materials Today", Nov. 2006, pp. 36-45, vol. 9, No. 11.

* cited by examiner

METHOD OF USING A MAGNETORESISTIVE SENSOR IN SECOND HARMONIC DETECTION MODE FOR SENSING WEAK MAGNETIC FIELDS

BACKGROUND

Magnetic tunnel junctions (MTJs) have high magnetoresistance ratio (i.e., $(R_{max}-R_{min})/R_{min}=\Delta R/R$) on the order of 100's of % and are currently used to measure moderate to high levels of magnetic fields. Magnetic tunnel junctions also have a high 1/f noise. The high noise density at low frequencies prevents the use of MTJs for measuring small levels of magnetic field at frequencies less than of the order of a kHz.

SUMMARY

The application is directed to a method to measure a magnetic field. The method includes applying an alternating drive current to a drive strap overlaying a magnetoresistive sensor to shift an operating point of the magnetoresistive sensor to a low noise region. An alternating magnetic drive field is generated in the magnetoresistive sensor by the alternating drive current. When the magnetic field to be measured is superimposed on the alternating magnetic drive field in the magnetoresistive sensor, the method further comprises extracting a second harmonic component of an output of the magnetoresistive sensor. The magnetic field to be measured is proportional to a signed amplitude of the extracted second harmonic component.

The details of various embodiments of the claimed invention are set forth in the accompanying drawings and the description below. Other features and advantages will become apparent from the description, the drawings, and the claims.

DRAWINGS

Like reference numbers and designations in the various drawings indicate like elements.

DETAILED DESCRIPTION

Figure 1A:
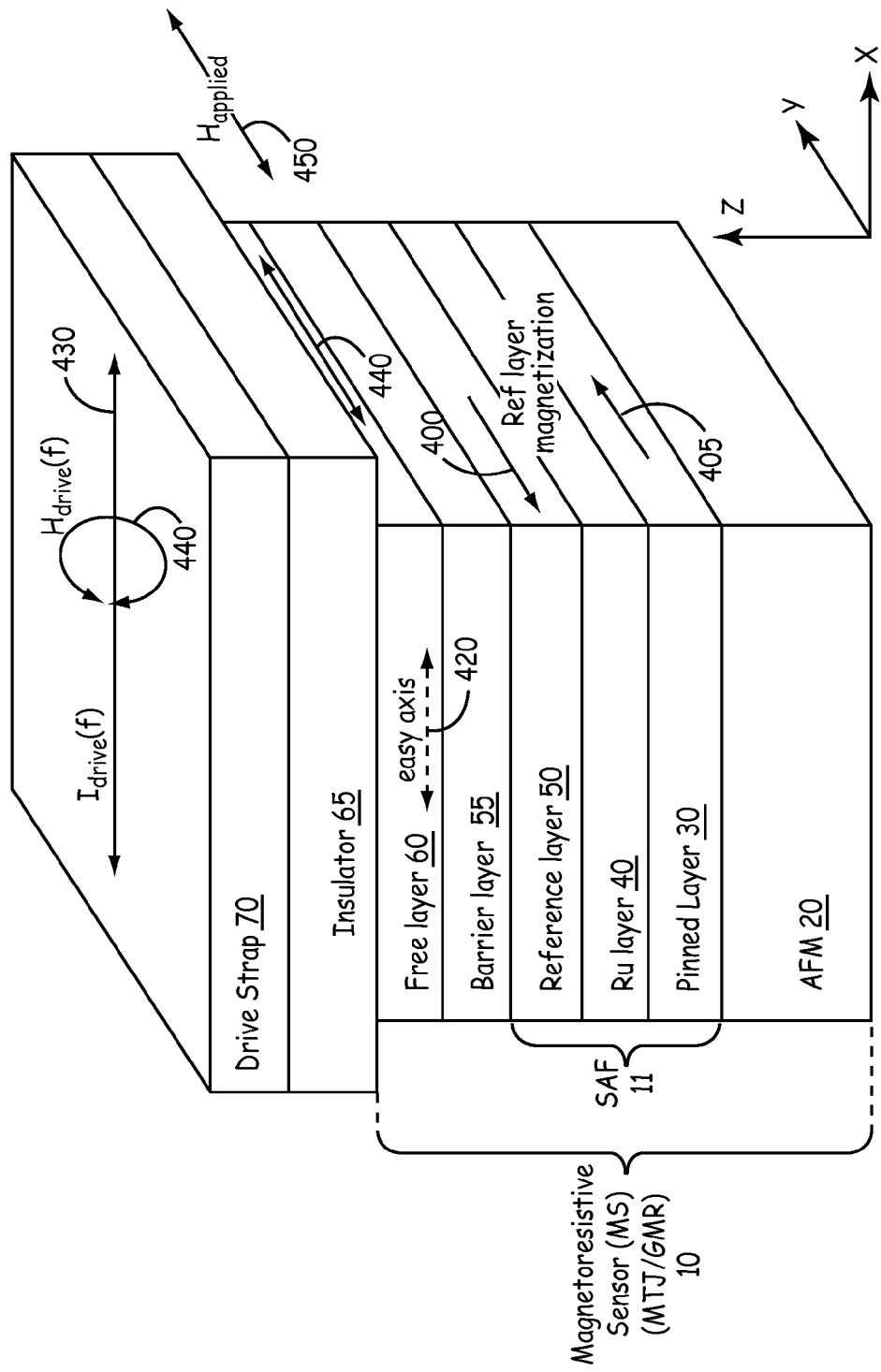
FIG. 1A is a block diagram of one embodiment of a multilayered MagnetoResistive (MR) sensor and drive strap in accordance with the present invention.

Magnetoresistive (MR) sensors are used for magnetic compassing, magnetic anomaly detection, gear-tooth sensing, etc., i.e., in any application where small values of magnetic field, or small changes in Earth's magnetic field must be sensed. Fluxgates and Superconducting Quantum Interference Devices (SQUIDS) are bulk level magnetic sensors capable of measuring small values of magnetic field or small changes in magnetic fields.

Chip scale magnetoresistive sensors can be made at low cost and are thus advantageous over bulk level magnetoresistive sensors. Anisotropic MagnetoResistance (AMR) sensors, GMR sensors and MTJ sensors are manufactured on a chip scale. GMR and MTJ stacks include a ferromagnetic free layer having a switchable magnetization orientation, a ferromagnetic reference layer having a fixed magnetization orientation, and a barrier layer therebetween. Anisotropic magnetoresistors (AMR) have magnetoresistive ratios $\Delta R/R$ of about 2-3%. Giant magnetoresistors advantageously provide higher magnetoresistive ratios $\Delta R/R$ on the order of 10's of %. Magnetic tunnel junctions (MTJs) provide even higher magnetoresistive (MR) ratios on the order of 100's of %.

Another advantage of chip scale GMR or MTJ sensors is their small size. For example, multilayered magnetoresistive sensors (GMR or MTJ) can have dimensions of the order of a few 10's to 100's nm. Thus, a 200 nm wide metal line overlaying a 100-150 nm wide MTJ has a "field conversion factor" of 32 μAmp/Oe, and a micron wide line has a field conversion factor of 159 μAmp/Oe. Thus, fields required to switch or saturate the free layer of an appropriately built multilayered magnetoresistive sensor are produced by applying modest currents to such sensor using Application-Specific Integrated Circuits (ASICs) requiring modest power consumption.

However, noise power spectral density (including the 1/f and Barkhausen noise components) of multilayered magnetoresistive sensors is higher than that of AMR sensors. For magnetic changes occurring at low frequencies, the 1/f noise dominates, thus the higher magnetoresistance ratios multilayered magnetoresistive sensors do not translate into correspondingly higher signal-to-noise ratio. In order to translate the high magnetoresistance ratios of such sensor into a low minimum detectable field (mdf) or noise equivalent field resolution, it is important to improve the signal-to-noise (SN) ratio. At frequencies above the knee of a 1/f noise versus frequency plot, the signal-to-noise (SN) ratio increases. The second source of noise, Barkhausen noise, can be reduced by the use of closed loop techniques or offset techniques described herein.

Embodiments of systems and methods to improve the signal-to-noise ratio for multilayered magnetoresistive sensors are described herein. The sensor systems described herein take advantage of unique properties of magnetic tunnel junctions and/or giant magnetoresistors that enable low cost, and low power consumption with high resolution. The term multilayered MR sensor as used herein applies to both magnetic tunnel junction sensors and giant magnetoresistor sensors that have magnetoresistance ratios greater than AMR sensors. The systems and methods described herein can be used with AMR sensors but the low magnetoresistance ratios of the AMR sensors limit the advantages of such AMR-based systems.

FIG. 1A is a block diagram of one embodiment of a multilayered MR sensor 10 and drive strap 70 in accordance with the present invention. An insulator 65 and the drive strap 70 overlay the magnetoresistive sensor 10. The insulating layer 65 is positioned between the ferromagnetic free layer 60 and the overlaying drive field strap 70. The function of the drive strap 70 is described below with reference to FIGS. 3A, and 4-9. The multilayered MR sensor 10 includes an antiferromagnet (AFM) 20, a synthetic antiferromagnet (SAF) 11, a barrier layer 55, and a free layer 60 stacked from bottom to top. The synthetic antiferromagnet 11 includes a ferromagnetic pinned layer 30, a Ru layer 40, and a reference layer 50 stacked from bottom to top. The "barrier layer 55" is also referred to herein as "barrier 55". The barrier 55 is an oxide insulator barrier if the sensor 10 is a magnetic tunnel junction sensor. The barrier 55 is a conductive non-magnetic metal layer if the sensor 10 is a GMR sensor.

The reference layer magnetization 400 of the reference layer 50 in a properly designed AFM/SAF structure is "fixed", i.e., an applied magnetic field (up to a high level, typically ~kOe) does not significantly change the reference layer magnetization 400. Thus, the reference layer 50 is a referred to as a hard layer. In the exemplary magnetoresistive sensor 10 shown in FIG. 1A, the reference layer magnetization 400 of the reference layer 50 is parallel to the Y axis.

The reference layer 50 lays directly under the barrier 55, which separates the reference layer 50 from a free layer 60. The free layer 60 has an easy axis 420. The magnetic drive field $H_{drive}(f)$ 440 and any applied magnetic field $H_{applied}$ 450 easily change the magnetization of the free layer 60. Thus, the free layer 60 is a referred to as a soft layer. For a linear sensor, the easy axis 420 of the free layer 60 is designed to be perpendicular to reference layer magnetization 400. In the exemplary magnetoresistive sensor 10 shown in FIG. 1A, the easy axis 420 of the free layer 60 is parallel to the X.

The easy axis 420 is the net sum of all the magnetic interactions at the free layer 60. The free layer easy axis 420 is set through shape anisotropy or through a field anneal of the junction subsequent to the setting of the pinned layer 30 at a lower temperature than used for setting the pinned layer 30 as is known to one skilled in the art. If a low frequency magnetic field $H_{applied}$ 450 is applied to the free layer 60 in a direction other than the direction of the easy axis 420, the free layer magnetization is rotated away from the easy axis 420 toward the applied magnetic field. The effects of the magnetic drive field $H_{drive}(f)$ resulting from the alternating drive current $i_{drive}(f)$ and the externally applied magnetic field $H_{applied}$ 450 are described below with reference to FIGS. 3A and 3B. The externally applied magnetic field $H_{applied}$ 450 is the field to be measured by the magnetic sensor 10. It can be a weak DC magnetic field or a weak magnetic field changing at low frequency that is much less than the drive frequency f.

The AFM 20 is typically made of an alloy such as NiMn, PtMn, IrMn or FeMn. Exchange bias is created on the pinned layer 30 by annealing SAF/AFM 11/20 in a field of the order of kOe at temperatures in the range of approximately 200° C.-350° C. for a few hours. This sets the direction of uncompensated spins in AFM 20 at the interface between AFM 20 and pinned layer 30 thus providing a bias field to the pinned layer 30. The strong antiferromagnetic coupling between the pinned layer 30 and reference layer 50 sets the direction of reference layer magnetization 400 opposite to that of pinned layer magnetization 405. The net magnetization of SAF 11 is tailored to be nearly zero. Thus, high applied fields of the order of several kOe are required to change the magnetization of pinned layer/reference layer pair 30/50.

The sensitive axis of the magnetoresistive sensor 10 is perpendicular to the free layer easy axis 420. The resistance R of the magnetoresistive sensor 10 is a function of the angle between the reference layer magnetization 400 and the free layer magnetization according to the formula $R(\theta)=R_0+\Delta R(1-\cos\theta)/2$, where $\theta$ is the angle between the reference layer magnetization and free layer magnetization. Thus, if only the field $H_{applied}$ 450 were applied to the sensor the rotation of the free layer magnetization under the influence of this applied field would produce a linear transfer function for the magnetoresistance for small values of this field, $\cos(\theta)$ varying linearly with the field $H_{applied}$.

Figure 1B:
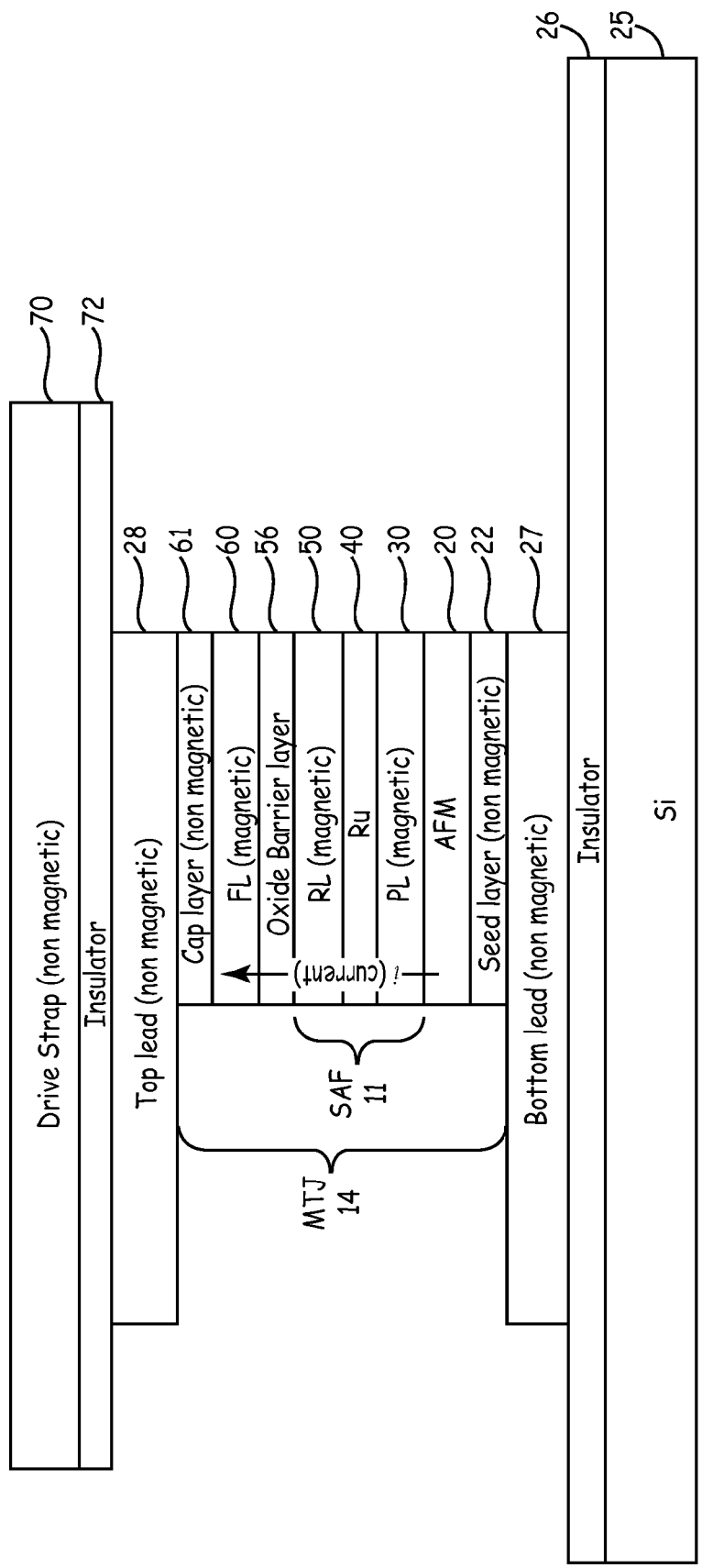
FIG. 1B is a block diagram of one embodiment of a Magnetic Tunnel Junction (MTJ), electrical contacts, and drive strap in accordance with the present invention.
Figure 2A:
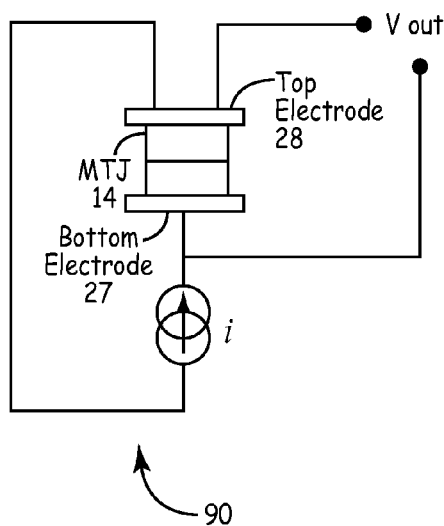
FIG. 2A is a block diagram of one embodiment of a circuit to measure output voltage of the magnetic tunnel junction of FIG. 1B in accordance with the present invention.

FIG. 1B is a block diagram of one embodiment of a magnetic tunnel junction 14, electrical contacts 27 and 28, and drive strap 70 in accordance with the present invention. The magnetic tunnel junction (MTJ) 14 is a magnetoresistive sensor 10 as shown in FIG. 1A. The barrier layer 55 shown in FIG. 1A is an oxide barrier layer 56 in the magnetic tunnel junction 14. A non-magnetic cap layer 61 overlays the free layer (FL) 60 of the magnetic tunnel junction 14. The electrical contact (bottom lead) 27 overlays an insulator 26 on a silicon (Si) substrate 25. A non-magnetic seed layer 22 overlaying the electrical contact 27 is used to facilitate growth of the AFM layer 20. The electrical contact (top lead) 28 overlays the cap layer 61. An insulator layer 72 isolates the electrical contact 28 from the drive strap 70. The electrical contacts 27 and 28 are configured to connect the magnetic tunnel junction 14 to a circuit to measure the magnetoresistance $R(\theta)$ of the magnetic tunnel junction 14. As shown in FIG. 1B, the current is directed from the bottom lead (electrical contact 27) to the top lead (electrical contact 28). FIG. 2A is a block diagram of one embodiment of a circuit 90 to measure output voltage $V_{out}$ of the magnetic tunnel junction 14 of FIG. 1B in accordance with the present invention. In one implementation of this embodiment, another insulator layer and an offset strap overlays the drive strap 70 of the magnetic tunnel junction 14.

Figure 1C:
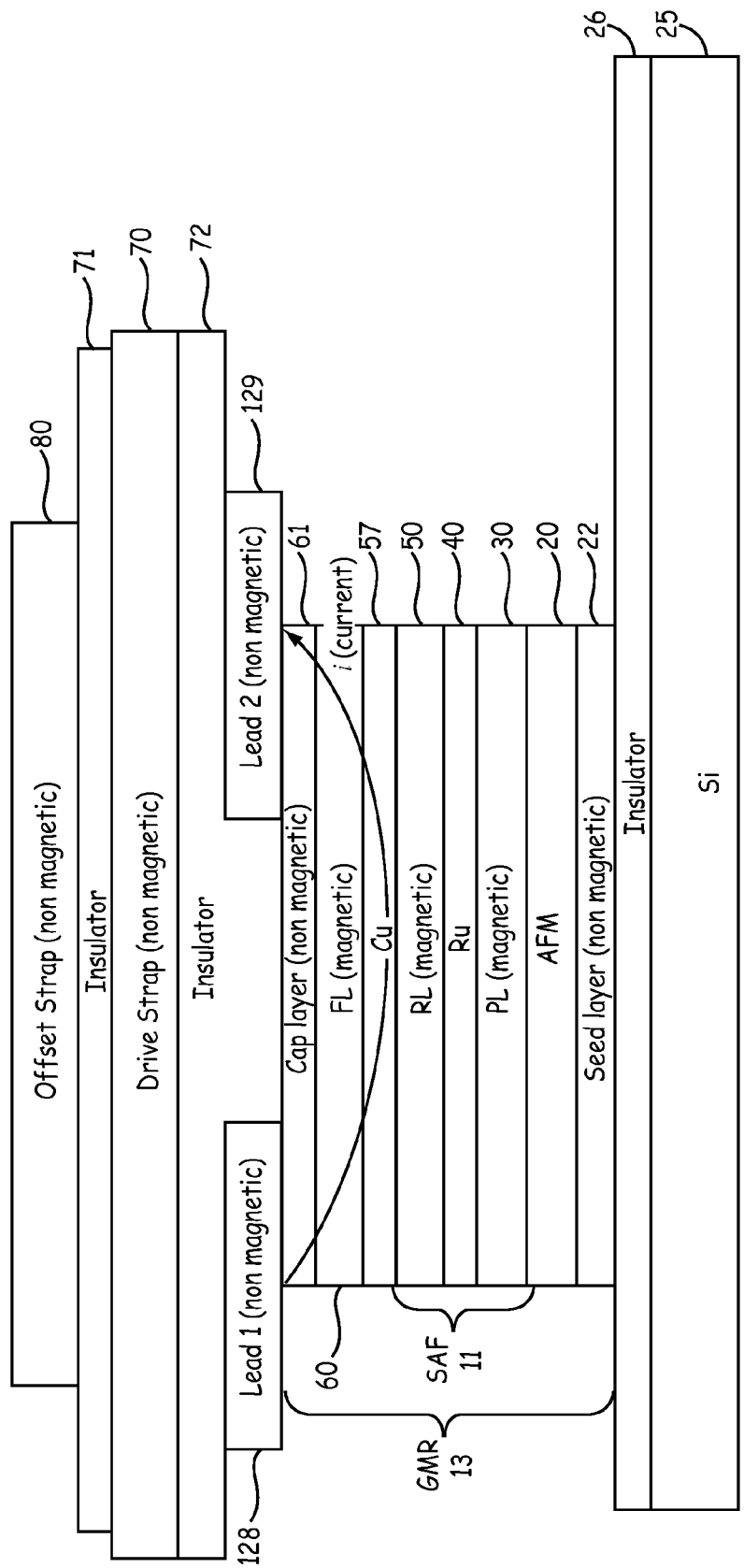
FIG. 1C is a block diagram of one embodiment of a Giant MagnetoResistance (GMR) sensor, electrical contacts, a drive strap, and an offset strap in accordance with the present invention.

FIG. 1C is a block diagram of one embodiment of a GMR sensor 13, electrical contacts 128 and 129, a drive strap 70, and an offset strap 80 in accordance with the present invention. The GMR 13 is a multilayered magnetoresistive sensor 10 as shown in FIG. 1A. The barrier layer 55 shown in FIG. 1A is a non-magnetic conductive layer 57 (such as, a Cu layer 57). The giant magnetoresistor 13 is operable in the current-in-plane (CIP) mode. A seed layer 22 overlaying insulator 26 is used to facilitate growth of the AFM layer 20. A non-magnetic cap layer 61 overlays the free layer 60 of the giant magnetoresistor 13. Two electrical contacts (lead 1 and 2) 128 and 129 overlay opposing edge portions of the cap layer 60. The electrical contacts 128 and 129 are separated from each other by the insulator layer 73. The insulator layer 73 also isolates the electrical contacts 128 and 129 from the drive strap 70, which is covered by an insulator layer 71. The offset strap 80 overlays the insulator layer 71. The function the offset strap 80 is described below with reference to FIGS. 7, 8, and 9.

Figure 2B:
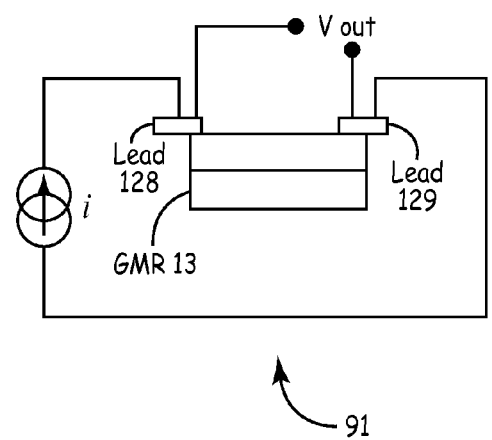
FIG. 2B is a block diagram of one embodiment of a circuit to measure output voltage of the giant magnetoresistor of FIG. 1C in accordance with the present invention.

The electrical contacts 128 and 129 are configured to connect the magnetoresistive sensor 10 to a circuit to measure the magnetoresistance of the giant magnetoresistor 13. As shown in FIG. 1C, the current is directed from lead 1 (electrical contact 128) to lead 2 (electrical contact 129). FIG. 2B is a block diagram of one embodiment of a circuit 91 to measure output voltage $V_{out}$ of the giant magnetoresistor 13 of FIG. 1C in accordance with the present invention.

In one implementation of this embodiment, there is no offset strap 80 overlaying the giant magnetoresistor 13. In another implementation of this embodiment, the giant magnetoresistor 13 is configured to operate in current-perpendicular to plane (CPP) mode as is known to one skilled in the art.

Figure 3A:
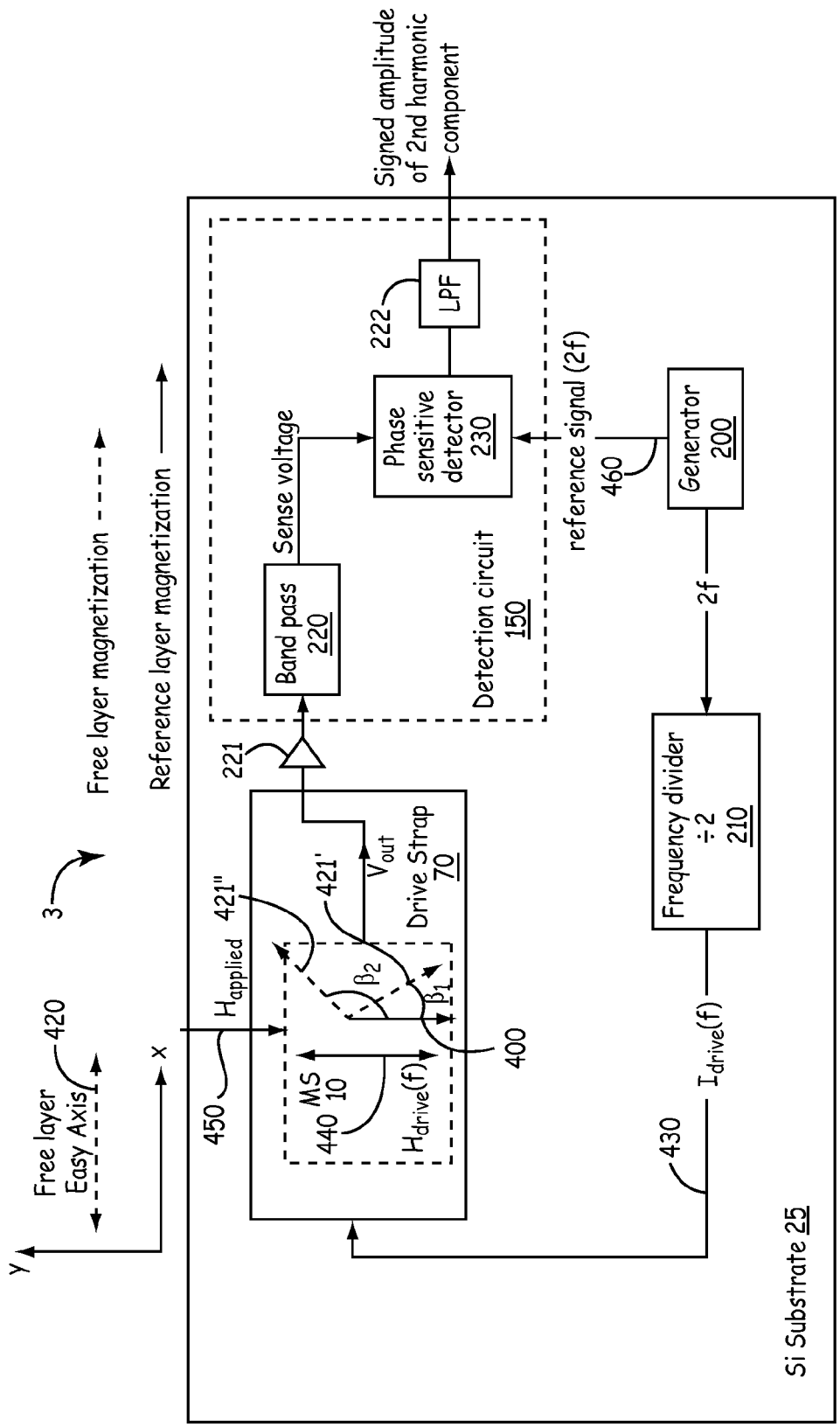
FIG. 3A is a block diagram of one embodiment of a magnetoresistive sensor system including the magnetoresistive sensor of FIG. 1A in accordance with the present invention.

FIG. 3A is a block diagram of one embodiment of a magnetoresistive sensor system 3 including the magnetoresistive sensor 10 of FIG. 1A in accordance with the present invention. The magnetoresistive sensor system 3 includes the magnetoresistive sensor 10, the drive strap 70, a detection circuit 150, a frequency generator 200, and a frequency divider 210. The magnetoresistive sensor 10 is shown as dashed box underlaying the drive strap 70 and is either a magnetic tunnel junction or a giant magnetoresistor.

The detection circuit 150 includes a bandpass filter 220 and a phase sensitive detector 230. The output of the phase sensitive detector 230 is input to a low pass filter 222. The output voltage $V_{out}$ is output from the magnetoresistive sensor 10 via amplifier 221 to the detection circuit 150. The bandpass filter 220 outputs a sense voltage to the phase sensitive detector 230. The phase sensitive detector 230 outputs information indicative of the amplitude and sign of the second harmonic component. The amplitude including sign of the second harmonic component of the output voltage is proportional to the magnetic field $H_{applied}$ 450 being detected. The "amplitude including sign of the second harmonic component" is also referred to herein as "signed amplitude of the second harmonic component" or "signed amplitude".

As shown in FIG. 1A, the magnetoresistive sensor 10 includes a ferromagnetic free layer 60 having a switchable magnetization orientation, a ferromagnetic reference layer 50 having a pinned magnetization orientation (reference layer magnetization 400), and a barrier layer 55 therebetween. The drive strap 70 overlaying the magnetoresistive sensor 10 is operably configured to carry an alternating drive current $i_{drive}$(f), which alternates with a frequency f. In FIG. 3A, the frequency generator 200 supplies the alternating drive current to the drive strap 70 via the frequency divider 210. The frequency generator 200 generates a reference signal alternating at frequency 2f and outputs the signal to the frequency divider 210. The frequency generator 200 also outputs the signal alternating at frequency 2f to the phase sensitive detector 230. The frequency divider 210 divides the signal alternating at frequency 2f in half and outputs the alternating drive current $i_{drive}$(f) at the frequency f to the drive strap 70. There are other techniques that can be used to apply alternating drive current $i_{drive}$(f) at the frequency f to the drive strap 70 as is understandable to one skilled in the art. The leads to connect the magnetoresistive sensor 10 to a circuit are not shown in FIG. 1A for ease of viewing the fields in the magnetoresistive sensor 10.

The drive current $i_{drive}$(f), which is shown in FIG. 1A as the double arrow labeled 430 in the drive strap 70, generates a magnetic drive field $H_{drive}$(f), which is shown in FIG. 1A as the circular-double arrow labeled 440. This magnetic drive field $H_{drive}$(f) 440 extends into the free layer 60, as shown by the double arrow labeled 440 in FIG. 1A. As the magnetic drive field $H_{drive}$(f) 440 oscillates in the ±Y direction, the free layer magnetization is periodically rotated away from the free layer easy axis 420 (FIG. 1A) to be parallel to the magnetic field in the free layer 60 (i.e., to be parallel and anti-parallel to the positive Y axis). The oscillating magnetic drive field $H_{drive}$(f) 440 shifts the operating point of the magnetoresis-tive sensor 10 beyond the knee of the 1/f power spectral density curve to take advantage of the high ΔR/R of the MTJ or GMR. Thus, the oscillating magnetic drive field $H_{drive}$(f) 440 advantageously permits the magnetoresistive sensor system 3 to achieve high signal-to-noise ratio, or conversely, to detect a small minimum detectable field (mdf).

The magnetoresistive sensor 10 (a magnetic tunnel junction 14 or a giant magnetoresistor 13) provides a transfer function between free layer's magnetic induction and resistance, so that voltage measurements can be made in the detection circuit 150.

Specifically, within a range of drive current $i_{drive}$(f) (with amplitude that is sufficiently high to saturate the free layer 60, but low enough that the reference layer 50 is substantially unaffected) the free layer magnetization 421 goes from positive to negative saturation along the y-axis producing a periodic resistance change in the magnetoresistive sensor 10. As shown in the top view of the magnetic sensor 10 in FIG. 3A, the free layer magnetization 421' at a first time $t_1$ is at the angle $β_1$ from the reference layer magnetization 400 and at a time $t_2$, the free layer magnetization 421" is at the angle $β_2$ from the reference layer magnetization 400. When only a periodic drive current is applied to the magnetoresistive sensor 10, and no DC (or low frequency) magnetic field $H_{applied}$ 450 is present along the Y axis, the ideal output of the magnetoresistive sensor 10 includes only odd harmonic multiples off.

When an external magnetic field to be measured $H_{applied}$ 450 is applied to the magnetoresistive sensor 10, the magnetic field to be measured $H_{applied}$ 450 is superimposed on the alternating magnetic drive field $H_{drive}$(f) in the magnetoresistive sensor 10 and the output of magnetoresistive sensor 10 develops even harmonic components. The lowest order even harmonic is the second harmonic component at frequency 2f. In this case, the magnetic field in the free layer 60 includes the oscillating magnetic drive field $H_{drive}$(f) 440 and the externally applied magnetic field 450, which is to be measured by the magnetic sensor 10. The detection circuit 150 extracts the second harmonic component of the output $V_{out}$ of the magnetoresistive sensor 10. The signed amplitude of the second harmonic component plotted versus applied magnetic drive field $H_{applied}$ 450 is the transfer function of the magnetoresistive sensor 10. For small values of $H_{applied}$ ($H_{applied}$<<amplitude of $H_{drive}$) parallel to the Y axis, the signed amplitude of the second harmonic is proportional to the DC field $H_{applied}$.

By driving the sensor at a frequency f that is past the knee of the 1/f noise curve, the signal-to-noise ratio of the magnetoresistive sensor 10 is higher than the signal-to-noise ratio of the magnetoresistive sensor in operation near zero frequency.

The frequency generator 200 outputs a spectrally pure driving waveform without any second harmonic components. If there are even harmonic components present in the drive current $i_{drive}$(f), there will be even harmonic components present in the output $V_{out}$ even in the absence of an applied field (so called null offset). If a spectrally pure driving waveform is not produced by the frequency generator 200, the null offset at the output of the detection circuitry can be calibrated out by the user.

Figure 3B:
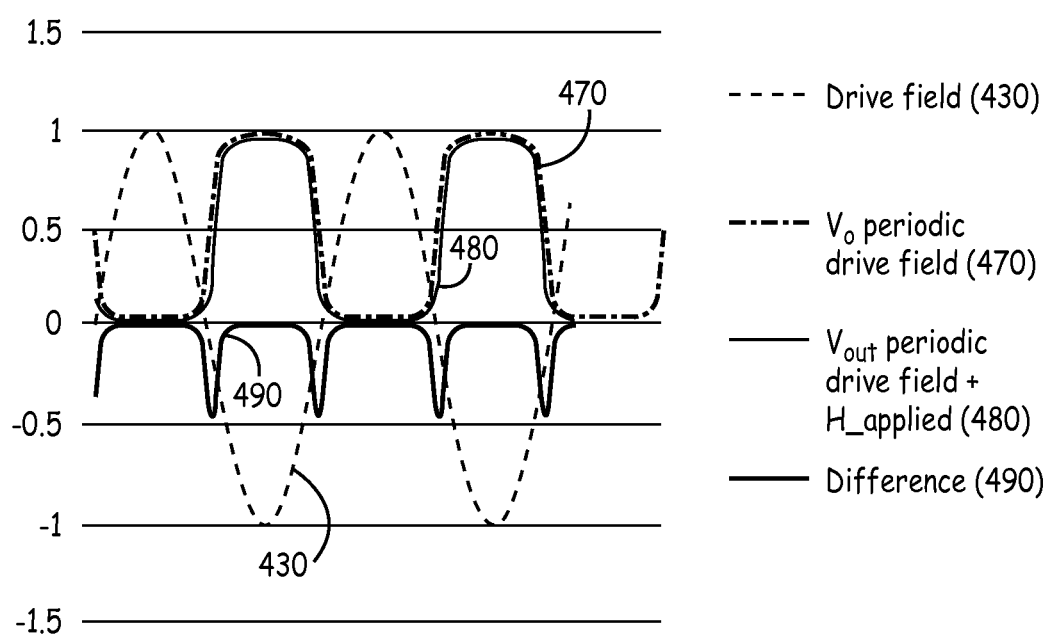
FIG. 3B is a simulated output in the second harmonic mode.

FIG. 3B is a simulated output in the second harmonic mode. The alternating magnetic drive field $H_{drive}$(f) 430 is shown as a sinusoidal dashed line. Periodic waveforms other than pure sinusoids, can be used for the magnetic drive field $H_{drive}$(f) as is understandable to one skilled in the art upon reading and understanding this document. Because of the nonlinearity of the M-H loop of the free layer 60, the alternating magnetic drive field $H_{drive}$(f) 430 results in a nearly squared output $V_{out}$ waveform 470. The small size of magnetoresistive sensors 10 described herein allows for the in-situ straps to be used for driving the magnetoresistive sensor 10 from positive to negative saturation at very modest current and power consumption.

When the applied DC magnetic field $H_{applied}$ parallel to the Y axis is superimposed on the alternating magnetic drive field $H_{drive}(f)$, a slightly distorted waveform 480 (from the original waveform 470) is generated. The difference waveform 490 has only even harmonics and the amplitude of the second harmonic component is proportional to the applied DC magnetic field $H_{applied}$ parallel to the Y axis.

The above operation was described for the case where the reference layer magnetization 400 is fixed along the Y axis, and the free layer easy axis 420 is parallel to the X axis. The second harmonic operation works equally well when the free layer easy axis 420 is parallel to the Y axis, i.e., the free layer magnetization is parallel or antiparallel to the reference layer magnetization 400 in the absence of an applied field $H_{applied}$ incident on the magnetoresistive sensor 10 (i.e., the null state of the magnetoresistive sensor 10).

Referring now to FIG. 3A, the detection circuit 150 takes as input the output voltage $V_{out}$ being output from the magnetoresistive sensor 10 and determines the signed amplitude of the second harmonic component of the output voltage $V_{out}$. The band pass filter 220 takes as input the amplified output voltage $V_{out}$ being output from the magnetoresistive sensor 10 and passes the sense voltage in a narrow frequency range around 2f to the phase sensitive detector 230. The phase sensitive detector 230 takes as input the sense voltage in a narrow frequency range around 2f from the band pass filter 220 and also takes as input a reference signal alternating at frequency 2f from the generator 200.

The phase sensitive detector 230 generates a voltage that includes a DC component that is proportional to the signed amplitude of the second harmonic component of the output voltage $V_{out}$. Since the phase sensitive detector 230 receives the reference signal 460 alternating at frequency 2f as input from the generator 200, aliasing effects may result in non-DC components being output from the phase sensitive detector 230. Therefore, the output of the phase sensitive detector 230 is passed through a low pass filter 222 to remove any non-DC components. In this manner, the detection circuit 150 determines the amplitude and sign of a second harmonic component of the output voltage $V_{out}$. The amplitude including sign of the second harmonic component of the output voltage is proportional to the magnetic field $H_{applied}$ 450 being detected.

As shown in FIG. 3A, the components of the magnetoresistive sensor system 3 are integrated on a silicon substrate 25. In one implementation of this embodiment, the magnetoresistive sensor 10 and drive strap 70 are integrated on the silicon substrate 25 and the other components are off chip.

Figure 4:
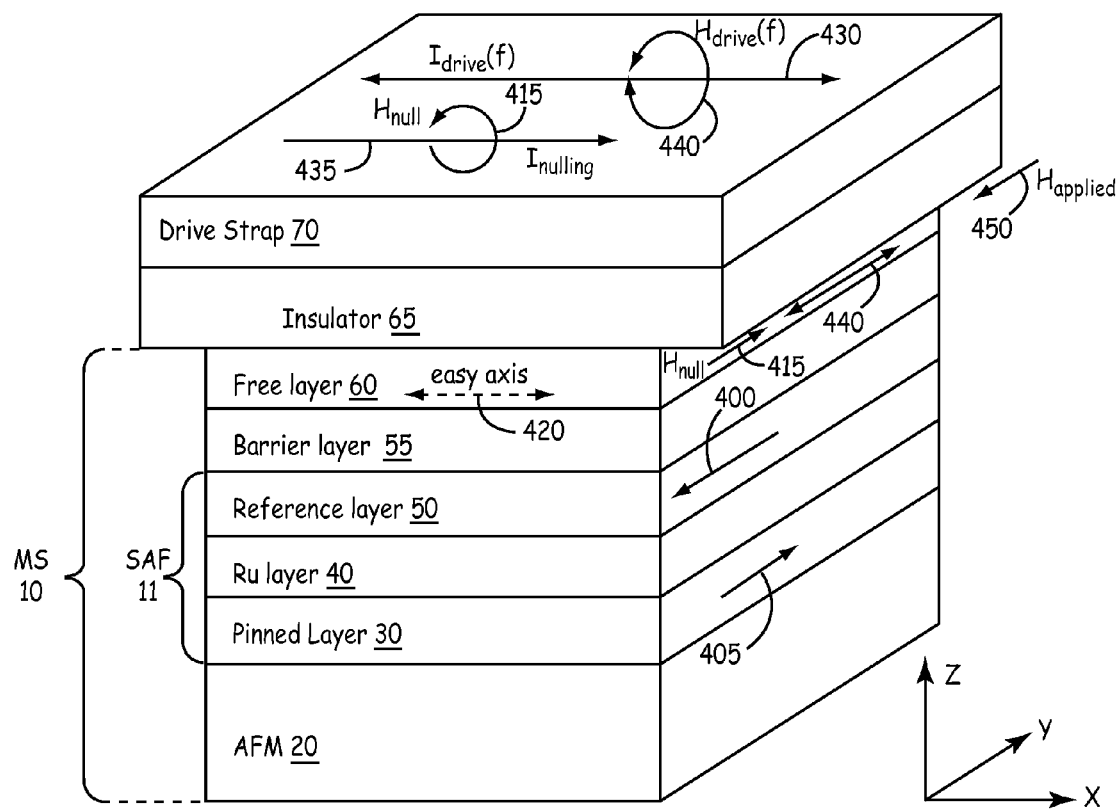
FIG. 4 is a block diagram of one embodiment of a magnetoresistive sensor and drive strap in accordance with the present invention.
Figure 5:
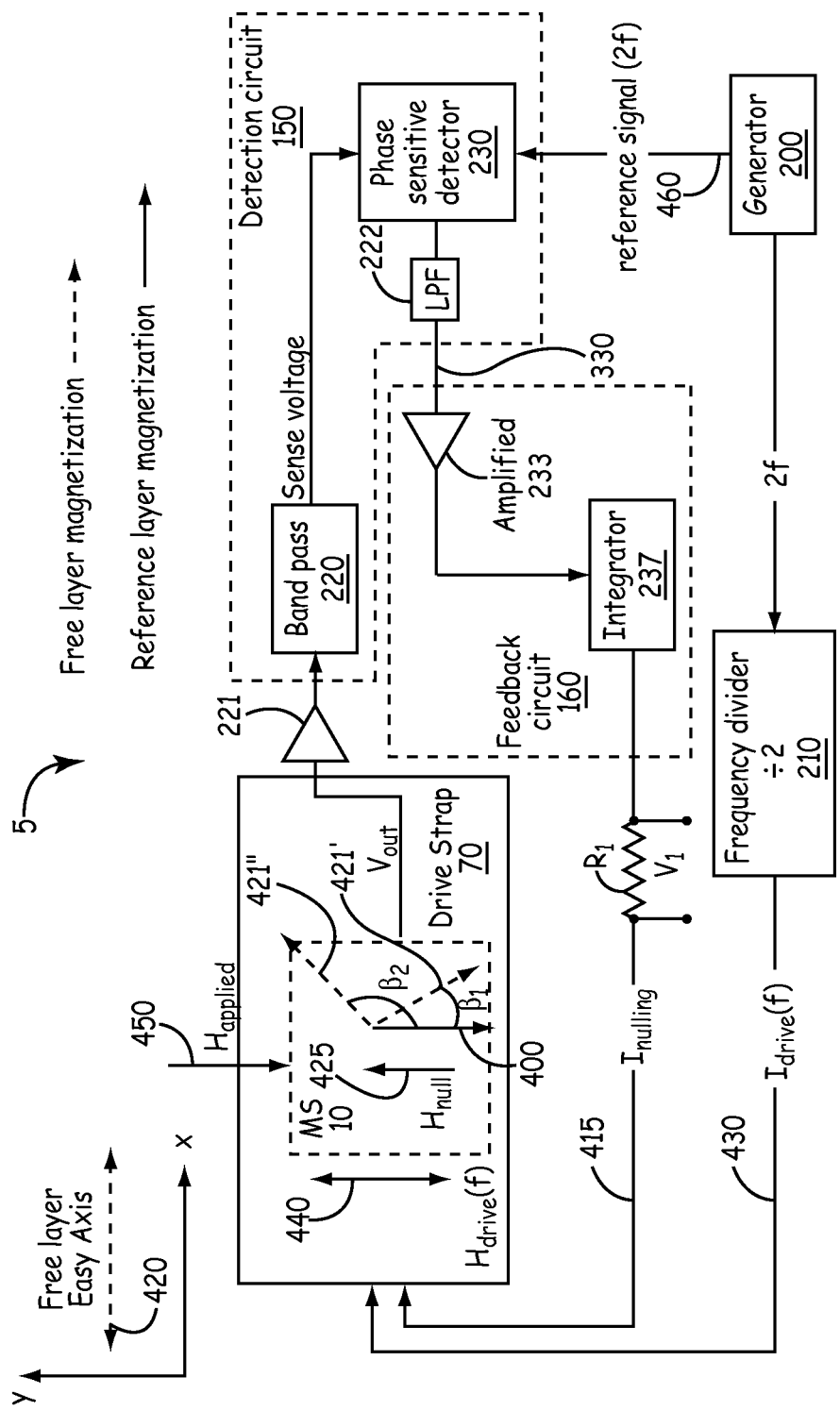
FIGS. 5 and 6 are block diagrams of embodiments of magnetoresistive sensor systems including the magnetoresistive sensor of FIG. 4 in accordance with the present invention.
Figure 6:
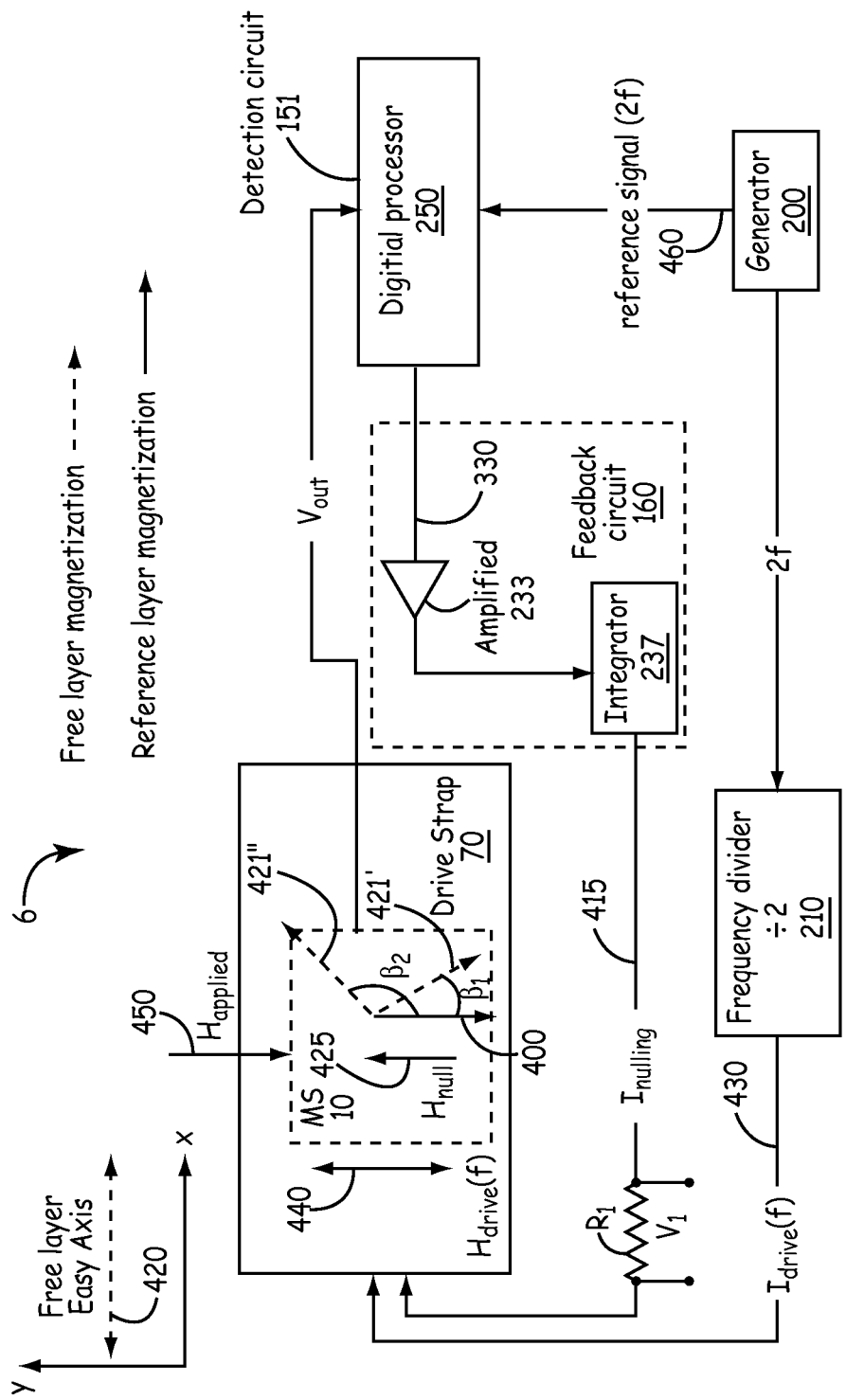

FIG. 4 is a block diagram of one embodiment of a magnetoresistive sensor 10 and drive strap 70 in accordance with the present invention. FIGS. 5 and 6 are block diagrams of embodiments of magnetoresistive sensor systems 5 and 6, respectively, including the magnetoresistive sensor 10 of FIG. 4 in accordance with the present invention. In one implementation of this embodiment, the magnetoresistive sensor 10 is a magnetic tunnel junction, such as, for example, the magnetic tunnel junction 14 shown in FIG. 1B. In another implementation of this embodiment, the magnetoresistive sensor 10 is a giant magnetoresistor, such as, for example, the giant magnetoresistor 13 shown in FIG. 1C. The drive strap 70 of FIG. 4 differs from the drive strap 70 of FIG. 1A in that a nulling current $i_{nulling}$ 415 is being applied in the positive X direction. The nulling current $i_{nulling}$ 415 generates a magnetic nulling field $H_{nulling}$ 415 directed in the positive Y direction at the free layer 60. The leads to connect the magnetoresistive sensor 10 to a circuit are not shown in FIG. 4 for ease of viewing the fields in the magnetoresistive sensor 10.

As shown in FIG. 5, the magnetoresistive sensor system 5 includes the magnetoresistive sensor 10, the drive strap 70, amplifier 221, a detection circuit 150, a low pass filter 222, a frequency generator 200, a frequency divider 210, and a feedback circuit 160. In this system the drive strap 70 is used to operate the magnetoresistive sensor 10 in a closed loop mode. The feedback circuit 160 includes an amplifier 233 and an integrator 237. The feedback circuit 160 provides the nulling current $i_{nulling}$ 415 to the drive strap 70 overlaying the magnetoresistive sensor 10 in order to generate a nulling magnetic field $H_{null}$ 425 opposing the magnetic field being detected ($H_{applied}$ 450). The feedback circuit 160 takes as input the signal 330 from the phase sensitive detector 230 and outputs the nulling current $i_{nulling}$ 415 to the drive strap 70. The signal 330 is proportional to the signed second harmonic component. The phase sensitive detector 230 outputs the signal 330 to the amplifier 233, which amplifies the signal 330 received from the phase sensitive detector 230. The output of the amplifier 233 is input to the integrator 237, which integrates the amplified signal 330 to generate a nulling current $i_{nulling}$ 415 that is proportional to the amplitude of the extracted second harmonic component. The nulling current $i_{nulling}$ 415 that is the output of the integrator 237 is input to the drive strap 70. The nulling current $i_{nulling}$ 415 generates the nulling magnetic field $H_{null}$ 425, which opposes the magnetic field to be measured $H_{applied}$ 450 in the magnetoresistive sensor 10.

As shown in FIG. 5, information indicative of the signed amplitude of the second harmonic component of the output voltage $V_{out}$ is sent to the feedback circuit 160 consisting of an amplifier 233, and integrator 237, which is known to one skilled in the arts. The feedback circuit generates a nulling current $I_{nulling}$ 415 as shown. The nulling current $i_{nulling}$ 415 can be measured by measuring the voltage drop across a stable series resistor $R_1$. The nulling current 415 or the corresponding voltage drop across the series resistor $R_1$ is proportional to $H_{applied}$. As shown in FIG. 5, the nulling current $i_{nulling}$ 415 produces a magnetic nulling field $R_{null}$ 425 that is equal and opposite to the applied magnetic field $H_{applied}$ 450.

Thus, the second harmonic signal 330 is amplified, integrated and used as feedback current (i.e., nulling current $i_{nulling}$ 415) to buck the external applied magnetic field $H_{applied}$ 450 on the same drive strap 70 that is used to apply the magnetic drive field $H_{drive}(f)$ 440. It is assumed that the time scales of the applied magnetic field $H_{applied}$ 450 and that of magnetic drive field $H_{drive}(f)$ 440 are well separated, i.e., applied magnetic field $H_{applied}$ 450 is of low frequency or near DC. In this manner, the only excursions of magnetization of the free layer 60 are those caused by periodic magnetic drive field $H_{drive}(f)$ 440. There is no DC shift in the magnetization states of the free layer 60 as the magnetoresistive sensor 10 senses a range of applied fields, since any applied magnetic field $H_{applied}$ 450 is nulled by the magnetic nulling field $H_{null}$ 425. This feedback reduces Barkhausen noise so that the signal-to-noise ratio of the magnetoresistive sensor 10 is further improved, and also increases the dynamic range of the magnetoresistive sensor 10.

The magnetoresistive sensor system 6 of FIG. 6 has the same function as the magnetoresistive sensor system 5 of FIG. 5. The magnetoresistive sensor system 6 of FIG. 6 differs in structure from the magnetoresistive sensor system 5 of FIG. 5 in that the detection circuit 150 is replaced by a digital processor 250. The digital processor 250 receives output voltage $V_{out}$ as input from the magnetoresistive sensor 10 and receives the reference signal 460 alternating at frequency 2f as input from the generator 200. The digital processor 250 extracts the second harmonic component from the output voltage $V_{out}$ output from the magnetoresistive sensor 10. The digital processor 250 generates a voltage proportional to the amplitude, with sign, of the second harmonic component of the input signal $V_{out}$. As described above with reference to FIG. 5, the output of the feedback circuit 160 is $I_{nulling}$, which is applied to the drive strap 70. In one implementation of this embodiment, an amplifier is positioned between the magnetoresistive sensor 10 and the digital processor 250.

Figure 7:
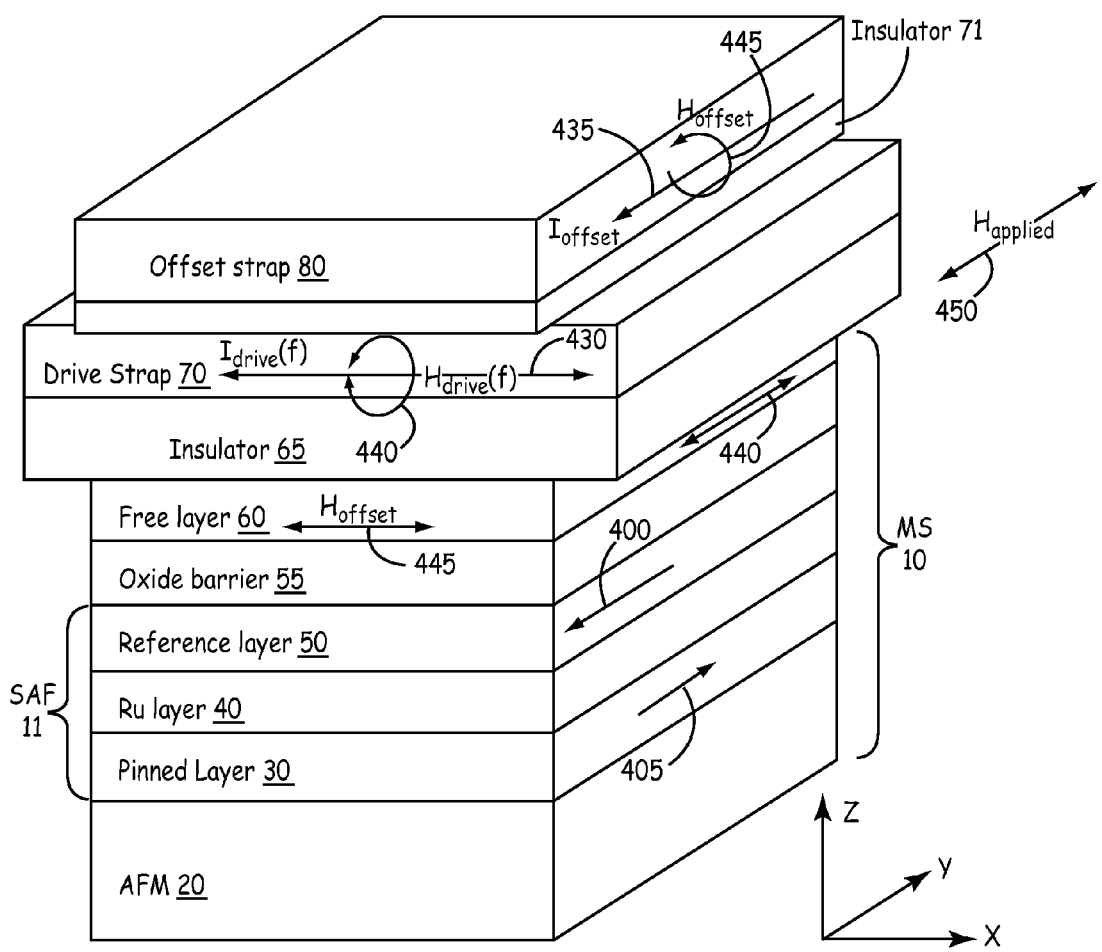
FIG. 7 is a block diagram of one embodiment of a magnetoresistive sensor, drive strap, and offset strap in accordance with the present invention.
Figure 8:
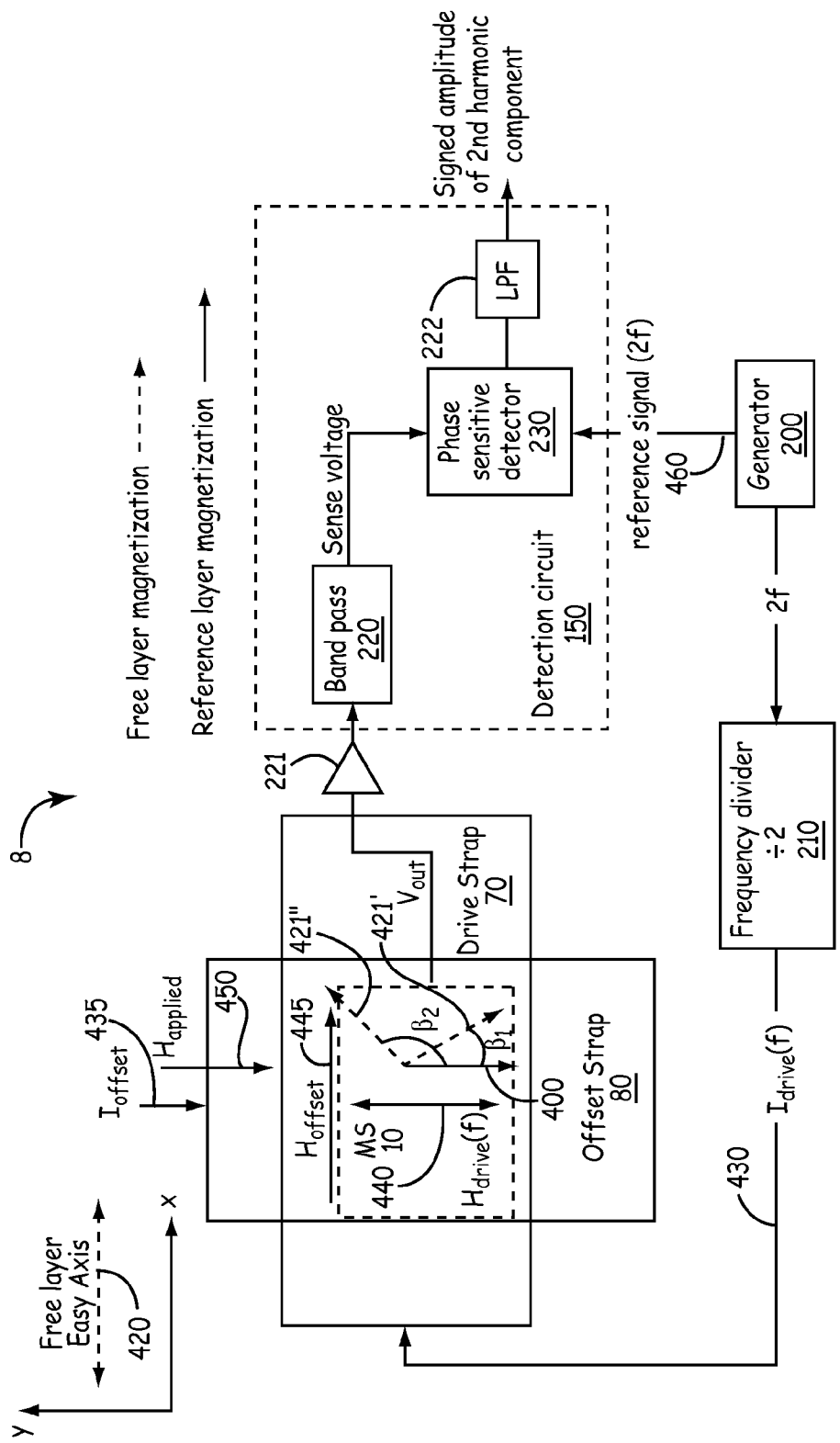
FIGS. 8 and 9 are a block diagrams of embodiments of magnetoresistive sensor systems including the magnetoresistive sensor of FIG. 7 in accordance with the present invention.
Figure 9:
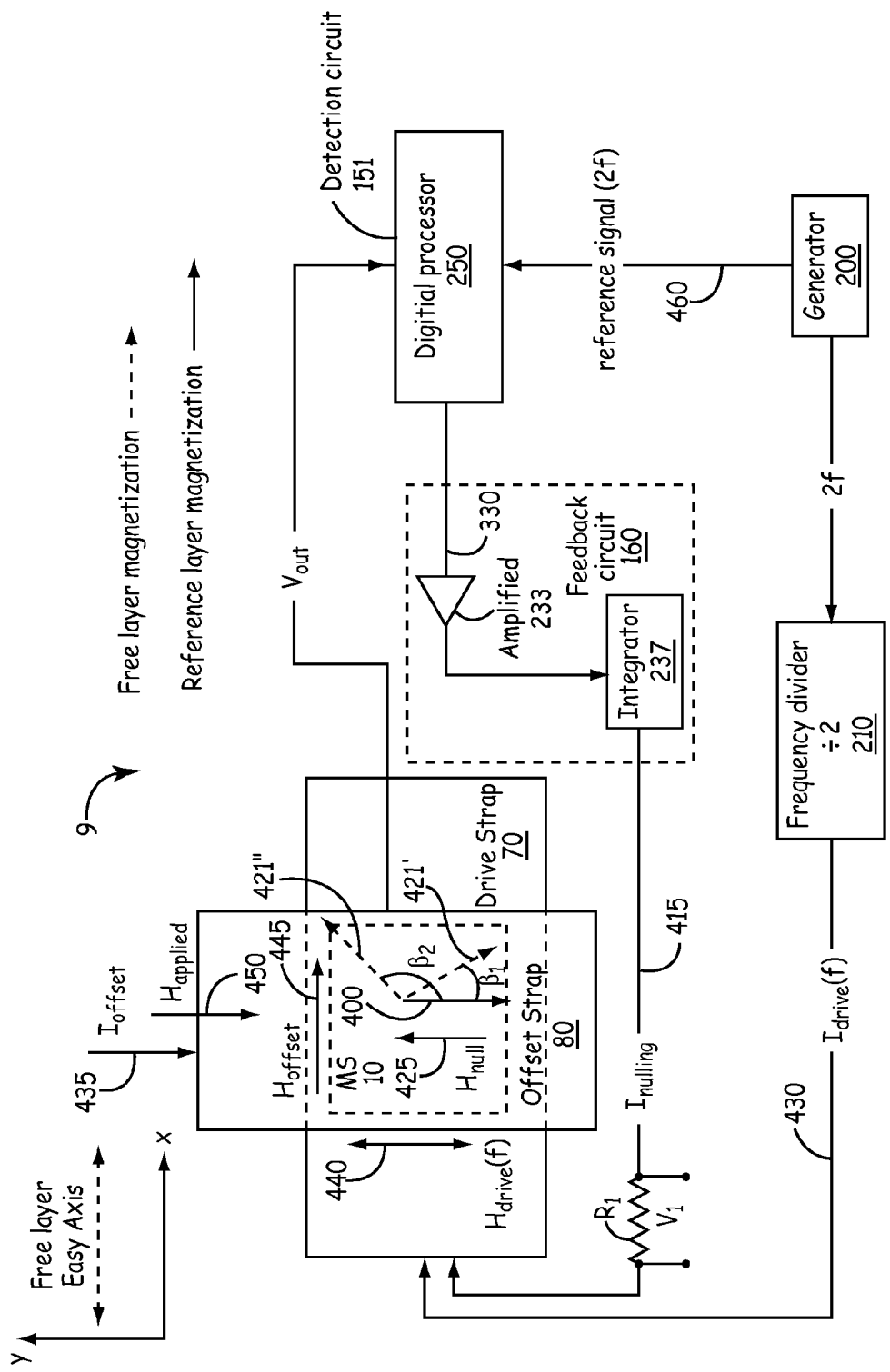

FIG. 7 is a block diagram of one embodiment of a magnetoresistive sensor 10, drive strap 70, and offset strap 80 in accordance with the present invention. FIGS. 8 and 9 are block diagrams of embodiments of magnetoresistive sensor systems 8 and 9, respectively, including the magnetoresistive sensor 10 of FIG. 7 in accordance with the present invention. As shown in FIGS. 7-9, an offset strap 80 overlays the drive strap 70. The structure of the magnetoresistive sensor system 8 shown in FIG. 8 differs from the magnetoresistive sensor system 3 of FIG. 3A in that the magnetoresistive sensor 10 is overlayed by the offset strap 80. The structure of the magnetoresistive sensor system 9 shown in FIG. 9 differs from the magnetoresistive sensor system 6 of FIG. 6 in that the magnetoresistive sensor 10 is overlayed by the offset strap 80. An insulator layer 71 isolates the offset strap 80 from the drive strap. The leads to connect the magnetoresistive sensor 10 to a circuit are not shown in FIG. 7 for ease of viewing the fields in the magnetoresistive sensor 10.

In one implementation of this embodiment, the magnetoresistive sensor 10 is a magnetic tunnel junction, such as, for example, the magnetic tunnel junction 14 shown in FIG. 1B. In another implementation of this embodiment, the magnetoresistive sensor 10 is a giant magnetoresistor, such as, for example, the giant magnetoresistor 13 shown in FIG. 1C. In yet another implementation of this embodiment, the drive strap 70 overlays the offset strap 80 and is separated from the offset strap 80 by the insulator layer 71.

The drive strap 70 of FIG. 7 is similar in structure and function to the drive strap 70 shown in FIG. 1A. The offset strap 80 is perpendicular to the drive field strap 70 and operationally carries an offset current $i_{offset}$ 435 that is perpendicular to the drive current $i_{drive}$ 430. The offset strap 80 generates an offset magnetic field $H_{offset}$ in the magnetoresistive sensor 10 that is perpendicular to the magnetic field to be measured $H_{applied}$ 450. The offset strap 80 controls the dynamics of the magnetization of the free layer 60 as it is being driven by the periodic magnetic drive field $H_{drive}(f)$ 440. The current source that generates the $i_{offset}$ 435 is not shown, but it can be any one of known current sources.

The dynamic of magnetization of the free layer 60 (the free layer magnetization 421) depends on the size, aspect ratio, and other material properties (grain size, defect density, $4\pi M_s$) of the free layer 60 and the magnetoresistive sensor 10. For larger magnetoresistive sensors 10 (>~1 µm) the dynamics of magnetization during switching from one state of saturation to the opposite state of saturation involves domain wall dynamics. Domain wall mediated switching generally involves Barkhausen jumps that are the source of Barkhausen noise. For magnetoresistive sensors 10 that have dimensions smaller than ~1 µm, the free layer 60 switches from one state of saturation to the opposite state of saturation by nucleation and the propagation of magnetic vortices. For either small or large dimensions the dynamics of free layer magnetization can involve "coherent rotation" under proper conditions in which case the Barkhausen noise is reduced.

Coherent rotation of the free layer magnetization 421 is ensured by maintaining an offset field $H_{offset}$ 445 that is generated by applying an offset current $i_{offset}$ 435 to the offset strap 80 during the operation of the magnetoresistive sensor 10. The magnitude of the offset current $i_{offset}$ 435 is determined empirically by examining the quality of the output waveform of the magnetoresistive sensor 10. Since the multilayered magnetoresistive sensors 10 have such small dimensions, the drive strap 70 and the offset strap 80 are operable at modest values of current and power.

As shown in FIG. 8, magnetoresistive sensor system 8 includes the amplifier 221 and the detection circuit 150 as described above with reference to FIG. 3A. As shown in FIG. 9, the magnetoresistive sensor system 9 includes the detection circuit 151 and the feedback circuit 160 as described above with reference to FIG. 6. In one implementation of this embodiment, an amplifier is positioned between the magnetoresistive sensor 10 and the digital processor 250.

Figure 10:
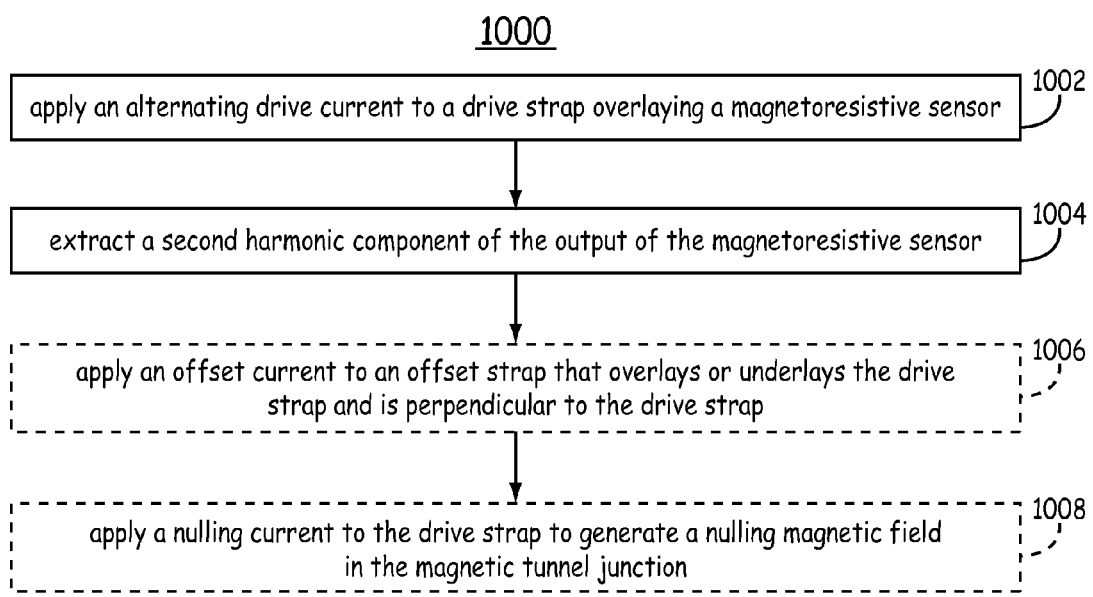
FIG. 10 is a flow diagram of one embodiment of a method to measure a magnetic field in accordance with the present invention.

FIG. 10 is a flow diagram of one embodiment of a method 1000 to measure a magnetic field $H_{applied}$ in accordance with the present invention. The method 1000 is applicable to the magnetoresistive sensor systems 3, 5, 6, 8, and 9 described above with reference to FIGS. 3A, 5, 6, 8 and 9, respectively.

At block 1002, an alternating drive current $i_{drive}(f)$ is applied to a drive strap 70 overlaying a magnetoresistive sensor 10 to shift an operating point of the magnetoresistive sensor 10 to a low noise region. The low noise region is above the knee in the 1/f noise spectrum. In one implementation of this embodiment, an alternating drive current $i_{drive}(f)$ is applied to a drive strap 70 overlaying a magnetic tunnel junction 14 (FIG. 1B) to shift an operating point of the magnetic tunnel junction to a low noise region. In another implementation of this embodiment, an alternating drive current $i_{drive}(f)$ is applied to a drive strap 70 overlaying a giant magnetoresistance sensor 13 (FIG. 1C) to shift an operating point of the giant magnetoresistive sensor to a low noise region.

An alternating magnetic drive field $H_{drive}(f)$ is generated in the magnetoresistive sensor 10 by the alternating drive current $i_{drive}(f)$ The alternating drive current $i_{drive}(f)$ is applied to a drive strap 70 as follows: a signal at an initial frequency 2f is output from a frequency generator 200 to a frequency divider 210; the signal at the initial frequency 2f is frequency divided in half to generate the signal at a drive frequency f; and the signal at the drive frequency f is input to the drive strap 70. The alternating drive current $i_{drive}(f)$ is alternating at the drive frequency f. The drive frequency f is half of the initial frequency 2f.

Block 1004 occurs when the magnetic field to be measured $H_{applied}$ 450 is superimposed on the alternating magnetic drive field $H_{drive}(f)$ in the magnetoresistive sensor 10. At block 1004, a second harmonic component of an output of the magnetoresistive sensor 10 is extracted.

In one implementation of this embodiment, the second harmonic component of the output of the magnetoresistive sensor 10 is extracted a as follows: an output voltage $V_{out}$ is output from the magnetoresistive sensor 10 to a digital processor 250; the output voltage is Fourier decomposed at the digital processor 250; a reference signal at the initial frequency is input to the digital processor 250 from the frequency generator 200; and the second harmonic component of the Fourier decomposed output voltage at the initial frequency (2f) is extracted. Then a signal indicative of the signed amplitude of the extracted second harmonic component of the output voltage $V_{out}$ is output from the digital processor 250. The magnetoresistive sensor systems 6 and 9 shown in FIGS. 6 and 9, respectively, are configured to extract the second harmonic component of the output of the magnetoresistive sensor 10 in this manner.

In another implementation of this embodiment, the second harmonic component of the output of the magnetoresistive sensor 10 is extracted as follows: an output voltage from the magnetoresistive sensor is filtered at a band pass filter 220; an output (sense voltage) of the band pass filter 220 is input to a phase sensitive detector 230; a reference signal at the initial frequency 2f is input to the phase sensitive detector 230 from the frequency generator 200; the second harmonic component of the filtered output voltage is extracted at the phase sensitive detector 230; and a signal indicative of the signed amplitude of the extracted second harmonic component of the output voltage is output from the phase sensitive detector 230. The magnetoresistive sensor systems 5 and 8 shown in FIGS. 5 and 8, respectively, are configured to extract the second harmonic component of the output of the magnetoresistive sensor 10 in this manner.

Blocks 1006 and 1008 are optional. One of or both of blocks 1006 and 1008 can be implemented in embodiments of the magnetoresistive sensor system. At optional block 1006, an offset current is applied to an offset strap 80 that overlays or underlays the drive strap 70 and is perpendicular to the drive strap 70. The offset strap 80 generates an offset magnetic field $H_{offset}$ 445 in the magnetoresistive sensor 10. The offset magnetic field $H_{offset}$ 445 is perpendicular to the magnetic field to be measured $H_{applied}$ 450. The offset magnetic field $H_{offset}$ 445 reduces or eliminates Barkhausen noise.

At optional block 1008, a nulling current $i_{nulling}$ 415 is applied to the drive strap 70 to generate a nulling magnetic field $H_{null}$ 425 in the magnetoresistive sensor 10. The nulling magnetic field $H_{null}$ 425 is parallel to and opposing the magnetic field to be measured $H_{applied}$ 450. The nulling magnetic field $H_{null}$ 425 reduces Barkhausen noise and increases the dynamic range of the sensor.

In one implementation of this embodiment, nulling current $i_{nulling}$ 415 is applied to the drive strap 70 to generate a nulling magnetic field $H_{null}$ 425 in the magnetoresistive sensor 10 as follows: the second harmonic signal at the initial frequency is amplified by amplifier 233; the amplified second harmonic signal is integrated to generate a nulling current $i_{nulling}$ 415 proportional to the signed amplitude of the extracted second harmonic component at the integrator 237; and the nulling current $i_{nulling}$ 415 is input from the integrator 237 to the drive strap 70. In this manner, the nulling magnetic field $H_{nulling}$ 425 opposing the magnetic field to be measured $H_{applied}$ 450 is generated in the magnetoresistive sensor 10. The magnetoresistive sensor systems 5, 6 and 9 of FIGS. 5, 6 and 9, respectively, are operable to apply a nulling current $i_{nulling}$ 415 to the drive strap 70 in this manner.

Each of the magnetoresistive sensor systems 3, 5, 6, 8, and 9 are operable to measure a magnetic field (including a weak DC magnetic field) by applying an alternating drive current $i_{drive}(f)$ to a drive strap 70 overlaying a magnetoresistive sensor 10 so that an alternating magnetic drive field $H_{drive}(f)$ is generated in the magnetoresistive sensor 10 by the alternating drive current $i_{drive}(f)$ The alternating drive current $i_{drive}(f)$ that is applied to the drive strap 70 shifts the operating point of the magnetoresistive sensor 10 to a low noise region. When the magnetic field $H_{applied}$ 450 to be measured is superimposed on the alternating magnetic drive field $H_{drive}(f)$ 440 in the magnetoresistive sensor 10, the second harmonic component of an output of the magnetoresistive sensor 10 is extracted. The amplitude of the second harmonic component is determined. The field to be measured $H_{applied}$ 450 is proportional to the amplitude, including sign, of the extracted second harmonic component. If an offset strap 80 is perpendicular to the drive strap 70 to carry a current $i_{offset}$, the Barkhausen noise is reduced or eliminated. If the drive strap 70 is operated in a closed loop so that nulling current $i_{nulling}$ 415 is also applied to the drive strap 70, the Barkhausen noise is reduced. As shown in FIG. 9, the magnetoresistive sensor system 9 uses both the offset strap 80 and a feedback circuit 161 to reduce the Barkhausen noise.

The various embodiments of magnetic sensors described herein are operated in second harmonic detection mode to sense weak magnetic fields at DC or low frequencies. In embodiments, some or all of the functions of second harmonic detection circuitry and feedback circuitry are integrated on the same Si chip on which MTJ or GMR is fabricated.

The magnetoresistive sensor systems described herein can be used for compassing, as an aid to navigation, for magnetic anomaly detection from distant objects such as vehicles, or in an array form for counterfeit or Trojan horse detection in circuit board or integrated circuit manufacturing.

A number of embodiments of the invention defined by the following claims have been described. Nevertheless, it will be understood that various modifications to the described embodiments may be made without departing from the spirit and scope of the claimed invention. For example, an alternating drive current can be generated by an external coil in place of the drive strap and an offset current can be generated by an external coil in place of the offset strap. For another example, the drive strap and/or offset strap can be formed below the AFM layer of the magnetoresistive sensor. Accordingly, other embodiments are within the scope of the following claims.

What is claimed is:

1. A method to measure a magnetic field, the method comprising:
applying an alternating drive current to a drive strap overlaying a magnetoresistive sensor to shift an operating point of the magnetoresistive sensor to a low noise region, wherein an alternating magnetic drive field is generated in the magnetoresistive sensor by the alternating drive current;
when the magnetic field to be measured is superimposed on the alternating magnetic drive field in the magnetoresistive sensor, extracting a second harmonic component of an output of the magnetoresistive sensor, wherein the magnetic field to be measured is proportional to a signed amplitude of the extracted second harmonic component.

2. The method of claim 1, further comprising applying an offset current to an offset strap that one of overlays or underlays the drive strap and is perpendicular to the drive strap, wherein the offset strap generates an offset magnetic field in the magnetoresistive sensor that is perpendicular to the magnetic field to be measured.

3. The method of claim 2, further comprising applying a nulling current to the drive strap to generate a nulling magnetic field in the magnetoresistive sensor, the nulling magnetic field being parallel to and opposing the magnetic field to be measured.

4. The method of claim 1, further comprising applying a nulling current to the drive strap to generate a nulling magnetic field in the magnetoresistive sensor, the nulling magnetic field being parallel to and opposing the magnetic field to be measured.

5. The method of claim 1, wherein applying the alternating current to the drive strap comprises:
outputting a signal at an initial frequency from a frequency generator to a frequency divider;
frequency dividing the signal at the initial frequency to generate a signal at a drive frequency, the drive frequency being half of the initial frequency; and inputting the signal at the drive frequency to the drive strap, wherein the alternating drive current is alternating at the drive frequency.

6. The method of claim 5, wherein extracting the second harmonic component of the output of the magnetoresistive sensor comprises:
outputting an output voltage from the magnetoresistive sensor to a digital processor; and
Fourier decomposing the output voltage at the digital processor;
inputting a reference signal at the initial frequency to the digital processor from the frequency generator; and
extracting the second harmonic component of the Fourier decomposed output voltage at the initial frequency, the method further comprising;
outputting a signal indicative of the signed amplitude of the extracted second harmonic component of the output voltage.

7. The method of claim 6, further comprising:
amplifying the signal indicative of the signed amplitude of the extracted second harmonic component;
integrating the amplified signal indicative of the signed amplitude of the extracted second harmonic component to generate a nulling current proportional to the amplitude of the extracted second harmonic component;
inputting the nulling current to the drive strap, wherein a nulling magnetic field opposing the magnetic field to be measured is generated in the magnetoresistive sensor.

8. The method of claim 5, wherein extracting the second harmonic component of the output of the magnetoresistive sensor comprises:
filtering an output voltage from the magnetoresistive sensor at a band pass filter;
inputting an output of the band pass filter to a phase sensitive detector;
inputting a reference signal at the initial frequency to the phase sensitive detector from the frequency generator; and
extracting the second harmonic component of the filtered output voltage at the phase sensitive detector, the method further comprising;
outputting a signal indicative of the signed amplitude of the extracted second harmonic component of the output voltage.

9. The method of claim 8, further comprising:
amplifying the signal indicative of the signed amplitude of the extracted second harmonic component;
integrating the amplified signal indicative of the signed amplitude of the extracted second harmonic component to generate a nulling current proportional to the amplitude of the extracted second harmonic component; and
inputting the nulling current to the drive strap, wherein a nulling magnetic field opposing the magnetic field to be measured is generated in the magnetoresistive sensor.

10. The method of claim 1, wherein applying an alternating drive current to a drive strap overlaying a magnetoresistive sensor to shift an operating point of the magnetoresistive sensor to a low noise region comprises one of:
applying an alternating drive current to a drive strap overlaying a magnetic tunnel junction to shift an operating point of the magnetic tunnel junction to a low noise region; or
applying an alternating drive current to a drive strap overlaying a giant magnetoresistance sensor to shift an operating point of the giant magnetoresistive sensor to a low noise region.

11. A magnetoresistive sensor system to detect a magnetic field, the magnetoresistive sensor system comprising:
a magnetoresistive sensor comprising a ferromagnetic free layer having a switchable magnetization orientation, a ferromagnetic reference layer having a pinned magnetization orientation, and a barrier layer therebetween;
a drive strap overlaying the magnetoresistive sensor to carry an alternating drive current;
a frequency generator to supply the alternating drive current to the drive strap;
a detection circuit to input an output voltage being output from the magnetoresistive sensor and to output a signal indicative of a signed amplitude of a second harmonic component of the output voltage, the signed amplitude of the second harmonic component of the output voltage being proportional to the magnetic field being detected.

12. The magnetoresistive sensor system of claim 11, further comprising:
a feedback circuit to provide a nulling current to the drive strap overlaying the magnetoresistive sensor to generate a nulling magnetic field opposing the magnetic field being detected.

13. The magnetoresistive sensor system of claim 12, wherein the detection circuit comprises;
a band pass filter to input the output voltage being output from the magnetoresistive sensor; and
a phase sensitive detector to input a sense voltage from the band pass filter and to input a reference signal from the frequency generator, and wherein the feedback circuit comprises:
an amplifier to amplify the signal indicative of the signed amplitude of the extracted second harmonic component received from the phase sensitive detector; and
an integrator to integrate the amplified signal indicative of the signed amplitude and to output the nulling current to the drive strap.

14. The magnetoresistive sensor system of claim 12, wherein the detection circuit comprises;
a digital processor to extract the second harmonic component of the Fourier decomposed output voltage and to output a signal indicative of the signed amplitude of the extracted second harmonic component and wherein the feedback circuit comprises:
an amplifier to amplify the signal indicative of the signed amplitude of the extracted second harmonic component received from the digital processor; and
an integrator to integrate the amplified signal indicative of the signed amplitude and to output the nulling current to the drive strap.

15. The magnetoresistive sensor system of claim 11, further comprising:
an insulating layer positioned between the ferromagnetic free layer and the overlaying drive field strap.

16. The magnetoresistive sensor system of claim 11, further comprising:
an offset strap perpendicular to the drive field strap to carry an offset current perpendicular to the drive current; and
an insulating layer positioned between the drive field strap and the offset strap.

17. The magnetoresistive sensor system of claim 16, wherein the magnetoresistive sensor, the drive strap, the offset strap, the frequency generator, and the detection circuit are integrated on a silicon substrate.

18. The magnetoresistive sensor system of claim 11, wherein the magnetoresistive sensor, the drive strap, the frequency generator, and the detection circuit are integrated on a silicon substrate.

19. The magnetoresistive sensor system of claim 11, wherein the magnetoresistive sensor is one of a magnetic tunnel junction or a giant magnetoresistor.

20. A magnetoresistive sensor system to detect a magnetic field, the magnetoresistive sensor system comprising:
- a magnetoresistive sensor comprising a ferromagnetic free layer having a switchable magnetization orientation, a ferromagnetic reference layer having a pinned magnetization orientation, and a barrier layer therebetween;
- a drive strap overlaying the magnetoresistive sensor to carry an alternating drive current at a drive frequency;
- a frequency generator to supply the alternating drive current to the drive strap;
- a digital processor operable to:
    - input a reference signal at an initial frequency twice the drive frequency from the frequency generator,
    - Fourier decomposing the output voltage, and
    - extract the second harmonic component of a Fourier decomposed output voltage, and
    - output a signal indicative of the signed amplitude of the extracted second harmonic component;
- an amplifier to amplify the signal indicative of the signed amplitude of the extracted second harmonic component received from the digital processor; and
- an integrator to integrate the amplified signal indicative of the signed amplitude and to output the nulling current to the drive strap; and
- a series resistor at the output of the integrator, wherein a voltage drop across the series resistor is proportional to the magnetic field to be measured.

* * * * *

UNITED STATES PATENT AND TRADEMARK OFFICE
CERTIFICATE OF CORRECTION

| | | |
|---|---|---|
| PATENT NO. | : 8,829,901 B2 | Page 1 of 1 |
| APPLICATION NO. | : 13/289800 | |
| DATED | : September 9, 2014 | |
| INVENTOR(S) | : Pant | |

It is certified that error appears in the above-identified patent and that said Letters Patent is hereby corrected as shown below:

In the claims

At Column 14, line 53, Claim 15, please replace "free layer and the overlaying drive field strap" with -- free layer and the overlaying drive strap --.

At Column 14, line 56, Claim 16, please replace "an offset strap perpendicular to the drive field strap" with -- an offset strap perpendicular to the drive strap --.

At Column 14, line 58, Claim 16, please replace "an insulating layer positioned between the drive field strap" with -- an insulating layer positioned between the drive strap --.

Signed and Sealed this
Thirteenth Day of October, 2015

Michelle K. Lee
*Director of the United States Patent and Trademark Office*